(12) United States Patent
Ojima et al.

(10) Patent No.: US 8,141,484 B2
(45) Date of Patent: Mar. 27, 2012

(54) SCREEN PRINTING PLATE AND SCREEN PRINTING APPARATUS

(75) Inventors: Satoyuki Ojima, Gunma (JP); Naoki Ishikawa, Gunma (JP); Hiroyuki Ohtsuka, Gunma (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 441 days.

(21) Appl. No.: 11/920,766

(22) PCT Filed: May 2, 2006

(86) PCT No.: PCT/JP2006/309149
§ 371 (c)(1),
(2), (4) Date: Nov. 20, 2007

(87) PCT Pub. No.: WO2006/134734
PCT Pub. Date: Dec. 21, 2006

(65) Prior Publication Data
US 2008/0196608 A1      Aug. 21, 2008

(30) Foreign Application Priority Data
Jun. 17, 2005    (JP) ................................. 2005-178096

(51) Int. Cl.
*B41N 1/24*    (2006.01)
(52) U.S. Cl. ........................................ 101/127; 101/114
(58) Field of Classification Search .................. 101/127, 101/114; 118/301; *B41N 1/24*
See application file for complete search history.

(56) References Cited

FOREIGN PATENT DOCUMENTS

| JP | A-05-270161 | 10/1993 |
|----|---|---|
| JP | A-10-065197 | 3/1998 |
| JP | A-10-151872 | 6/1998 |
| JP | A-10-329444 | 12/1998 |
| JP | A-11-154784 | 6/1999 |
| JP | 2002283535 A  * | 10/2002 |
| JP | A-2002-373995 | 12/2002 |
| JP | A-2004-195858 | 7/2004 |
| JP | A-2005-116559 | 4/2005 |

OTHER PUBLICATIONS

Dec. 2, 2010 Australian Office Action issued in Australian Application No. 2006257127.
Dec. 7, 2010 Japanese Office Action issued in Japanese Application No. 2005-178096.
Jul. 5, 2011 Decision of Refusal issued in Japanese Application No. 2005-178096 with partial English-language translation.

* cited by examiner

*Primary Examiner* — Leslie J Evanisko
(74) *Attorney, Agent, or Firm* — Oliff & Berridge, PLC

(57) ABSTRACT

A screen printing plate having at least an opening portion that discharges a printing material for forming a target printing pattern on a matter to be printed is provided in screen printing, and the screen printing plate is characterized in that the size of the opening portion is reduced from the target printing pattern and an opening end portion of the opening portion has a projection and recess pattern shaped differently from the target printing pattern shape. By this arrangement, bleeding of the printing material of the screen printing can be controlled and a high-quality and low-cost screen printing plate is provided which can print a target printing pattern accurately and with high transfer performance even for a fine design.

10 Claims, 4 Drawing Sheets

PRIOR ART

SCREEN PRINTING PLATE AND SCREEN PRINTING APPARATUS

TECHNICAL FIELD

The present invention relates to a screen printing plate provided with an opening portion that discharges a printing material for forming a target printing pattern on a matter to be printed in screen printing.

BACKGROUND ART

Screen printing is a printing method for printing a target printing pattern by pushing out a printing material such as ink or paste by a sliding operation of a squeegee through an opening portion on a screen printing plate and transferring the shape of the opening portion to the matter to be printed.

There are many types of screen printing plates used in the screen printing according to differences in the materials or manufacturing methods. Among them, those with an opening portion formed for printing with an emulsion on a screen fabric in which a thin metallic wire is woven or those with an opening portion formed for printing with etching or laser machining on a thin metal plate are generally used.

The screen printing has high productivity and is utilized in many industrial fields.

However, when a target printing pattern, particularly a fine design is to be printed using the screen printing, there is a problem that transfer performance is lowered by bleeding of a printing material from an opening end portion. In the meantime, particularly high transfer performance is in demand in the screen printing used in the electronics industry field.

For example, if a printing operation is carried out using a screen printing plate 1a with a straight opening end portion 3a in an opening portion 2a as shown in FIG. 3, a printing pattern 5a after printing, which is the shape of the end portion of the printing material, does not match a target printing pattern 4a due to bleeding of the printing material and does not become straight. Even though the opening end portion 3a is made straight essentially in order to make the end portion of the printing material straight, a printing area is expanded and the end portion of the printing material becomes irregular due to the bleeding of the printing material.

There can be various causes in complex for this bleeding phenomenon, but particularly, (1) high printing pressure, (2) surface shape of the matter to be printed, (3) mesh intersection, and (4) viscosity of the printing material can be cited.

One of methods to prevent such bleeding of the printing material is to provide a printing-material reservoir in a recess-shaped groove in the vicinity of an opening portion on the side in contact with a matter to be printed of a screen printing plate (See Japanese Patent Laid-Open No. 10-329444, for example).

Other methods of preventing bleeding include a method to provide a bank in the normal direction of a contact face with a matter to be printed at a given height along the opening end portion on the side in contact with the matter to be printed of a screen printing plate (See Japanese Patent Laid-Open No. 5-270161, for example).

However, with these methods, the manufacturing method of a screen printing plate becomes complicated and its manufacturing cost is increased, which is a problem.

The surface shape of the matter to be printed largely affects the bleeding phenomenon. For example, in a solar cell in which an electrode is produced by screen printing with a conductive paste, the surface shape of a matter to be printed (substrate) is a collection of a pyramid called as a texture, and the printing plate is not necessarily brought into close contact with the surface of the matter to be printed but a gap is generated. In that case, the above methods are not effective.

DISCLOSURE OF THE INVENTION

The present invention was made in view of the above problems and has an object to provide a screen printing plate which can control bleeding of a printing material of the screen printing and can print a target printing pattern accurately with high transfer performance even for a fine design with a reduced cost and high quality.

In order to achieve the above object, according to the present invention, a screen printing plate in which at least an opening portion that discharges a printing material for forming a target printing pattern on a matter to be printed in the screen printing, wherein the size of the opening portion is reduced from the target printing pattern and an opening end portion of the opening portion has a projection and recess pattern shape different from the target printing pattern shape is provided.

If the screen printing is carried out using the screen printing plate with the opening end portion of the opening portion having the projection and recess pattern shape different from the target printing pattern shape, a bleeding width of the printing material is increased in the vicinity of a recess portion (portion where the opening is smaller) in the projection and recess pattern in the opening end portion of the opening portion, while the bleeding width is decreased in the vicinity of a projection portion (portion where the opening is larger), and the printing pattern after printing becomes a smooth and regular shape. Thus, since irregularity of the printing pattern shape due to the bleeding of the printing material can be prevented, even if the target printing pattern is a fine design, the pattern shape as intended can be printed accurately with high transfer performance. Since the bleeding phenomenon can not be fully eliminated, by making the size of the opening portion smaller than the target printing pattern, the printing pattern shape after bleeding of the printing material can be matched with the target printing patterns shape.

At this time, it is preferable that the projection and recess pattern shape of the opening end portion of the opening portion has a projection portion located at a position reduced from the target printing pattern by 0 to 25 μm.

By locating the projection portion of the opening portion at a position reduced by 0 to 25 μm from the end portion of the target printing pattern, the printing pattern shape after bleeding of the printing material can be matched with the target printing pattern shape more accurately.

Also, the projection and recess pattern shape of the opening end portion of the opening portion preferably has the height of the projection portion with respect to the recess portion at 5 to 25 μm.

By setting the height of the projection portion with respect to the recess portion at 5 to 25 μm, the bleeding width of the printing material in the vicinity of the recess portion can be increased and the bleeding width in the vicinity of the projection portion can be decreased more effectively, and thus, the printing pattern after printing can be made smooth more effectively.

Moreover, the projection and recess pattern shape of the opening end portion of the opening portion preferably has a cycle of the projection and recess pattern at 5 to 50 μm.

By setting the cycle of the projection and recess pattern at 5 to 50 μm, the bleeding width of the printing material in the vicinity of the recess portion can be increased and the bleeding width in the vicinity of the projection portion can be decreased more effectively, and the printing pattern can be made smooth and regular more effectively. The shape of the regular printing pattern has its cycle matched with the projection and recess pattern of the opening end portion.

Also, the projection and recess pattern shape of the opening end portion of the opening portion preferably has the width of the recess portion at 5 to 25 µm.

By setting the width of the recess portion at 5 to 25 µm, the bleeding width of the printing material can be more effectively increased in the vicinity of the recess portion, and the printing pattern after printing can be made smooth more effectively.

Moreover, the projection and recess pattern shape of the opening end portion of the opening portion is preferably at least any one of shapes of a triangular wave, a rectangular wave and a sinusoidal wave or a combination thereof.

The projection and recess pattern shape can be formed into a projection and recess pattern having a simple and accurate synchronization by selecting at least any of the triangular wave, rectangular wave and sinusoidal wave or a combination thereof, which also facilitates design and manufacture of the projection and recess pattern and reduces manufacturing costs.

The projection and recess pattern shape of the opening end portion of the opening portion preferably has a bag-state recess portion formed cyclically.

By forming the bag-state recess portion cyclically in the projection and recess pattern shape, a spot where bleeding is positively generated can be produced and as a result, the bleeding can be controlled more effectively. That is, the bleeding can be positively guided immediately below a non-opening portion surrounded by this bag-state opening portion.

Moreover, the shape of the bag-state recess portion is preferably circular or trapezoidal.

By making the shape of the bag-state recess portion circular or trapezoidal, the bleeding can be easily guided, design and manufacture of the bag-state recess portion are facilitated and the manufacturing costs can be kept low.

Also, according to the present invention, a screen printing apparatus comprising at least the screen printing plate, a squeegee for having the printing material discharged through the opening portion by parallel movement on the screen printing plate for applying the printing material on the matter to be printed, and a parallel moving mechanism for parallelly moving the squeegee is provided.

By parallelly moving the squeegee by the parallel moving mechanism in the above screen printing apparatus and applying the printing material discharged through the opening portion of the screen printing plate on the matter to be printed, since the opening end portion of the opening portion in the screen printing plate has the projection and recess pattern shape different from the target printing pattern shape, the bleeding width of the printing material is increased in the vicinity of the recess portion in the projection and recess pattern in the opening end portion of the opening portion, while the bleeding width is decreased in the vicinity of the projection portion. As a result, the end portion of the printing pattern becomes a smooth and regular shape. Thus, since irregularity of the printing pattern shape due to bleeding of the printing material can be prevented, even if the target printing pattern is a fine design, the apparatus can print the pattern shape as intended with higher transfer performance and accuracy.

Particularly by the above screen printing apparatus, a solar cell characterized in that an electrode is formed by screen printing on the surface of a substrate is provided.

By providing a solar cell in which the electrode is formed by the screen printing in the above screen printing apparatus, a pattern such as a finger electrode can be printed accurately and with a lowered cost, by which an inexpensive and high quality solar cell can be obtained.

As mentioned above, according to the present invention, irregularity of the printing pattern shape due to bleeding of the printing material in screen printing can be prevented, and even if the target printing pattern is a fine design, a pattern shape as intended can be printed with high transfer performance and accuracy.

BEST MODE FOR CARRYING OUT THE INVENTION

The screen printing with high productivity is utilized in many industrial fields but it has a problem that the transfer performance is lowered by bleeding of a printing material from an opening end portion when a target printing pattern, particularly a fine design, is printed using the screen printing. On the other hand, particularly high transfer performance is in demand in the screen printing used in pattern printing or the like in the electronics industry field such as a solar cell.

Then, the applicants have devoted themselves in research and found out that by providing a screen printing plate provided with at least an opening portion that discharges a printing material for forming a target printing pattern on a matter to be printed in screen printing, in which the size of the opening portion is reduced from the target printing pattern and the opening end portion of the opening portion has a projection and recess pattern shape different from the target printing pattern shape, irregularity of the printing pattern shape due to bleeding of the printing material can be prevented, and even if a target printing pattern is a fine design, the pattern shape as intended can be printed accurately and with high transfer performance.

Embodiments of the present invention will be described in detail referring to the attached drawings, but the present invention is not limited to them.

Figure 1:
FIG. 1 is an outline plan view illustrating an example of a screen printing plate of the present invention, in which an opening end portion of an opening portion has a projection and recess pattern shape (triangular wave).
Figure 2:
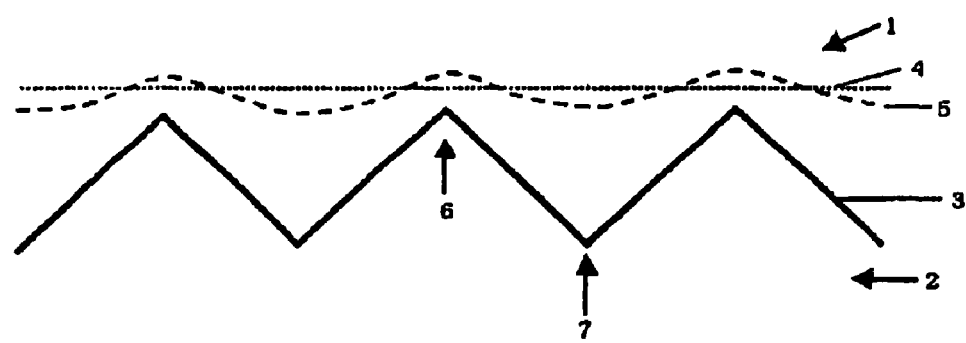
FIG. 2 is an outline plan view illustrating an example of the screen printing plate of the present invention, in which the opening end portion of the opening portion has a projection and recess pattern shape (triangular wave) and an example of the printing pattern after printing.
Figure 9:
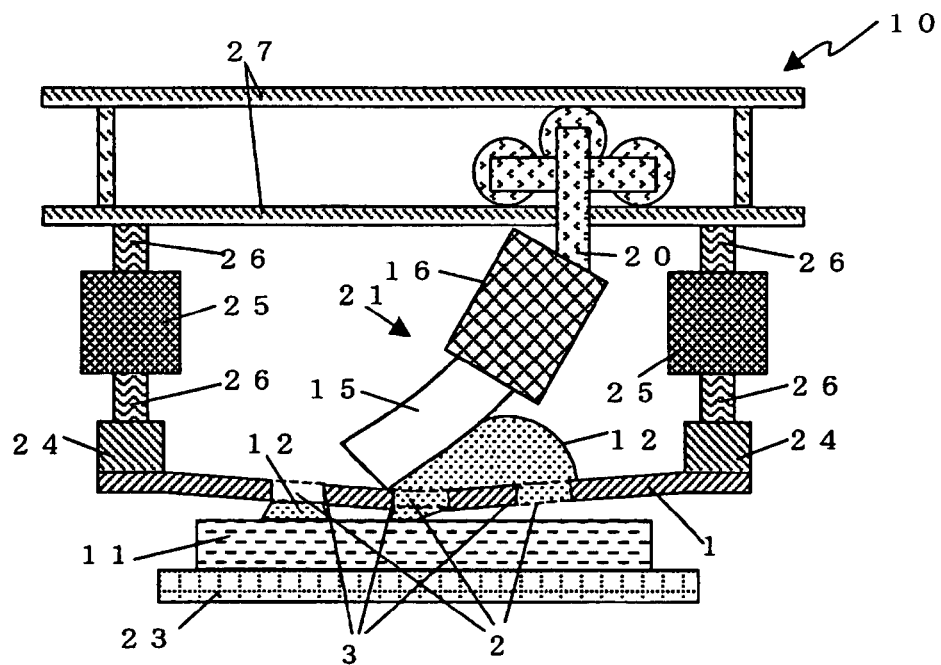
FIG. 9 is an outline sectional view of an example of a screen printing apparatus of the present invention.

FIGS. 1 and 2 are outline plan views illustrating an example of a screen printing plate of the present invention with an opening end portion of an opening portion having a projection and recess pattern shape (triangular wave). FIG. 9 is an outline sectional view of an example of a screen printing apparatus of the present invention.

A screen printing apparatus 10 using a screen printing plate 1 of the present invention is the screen printing plate 1 provided with at least an opening portion 2 that discharges a printing material 12 for forming a target printing pattern 4 on a matter to be printed 11 in screen printing and comprises the screen printing plate 1 in which the size of the opening portion 2 is reduced from the target printing pattern 4 and an opening end portion 3 of the opening portion 2 has a projection and recess pattern shape different from the shape of the target printing pattern 4, a squeegee 21 that discharges the printing material 12 through the opening portion 2 and applies it on the matter to be printed 11 fixed on a chuck table 23 by parallel movement on the screen printing plate 1, and a parallel moving mechanism 20 for parallelly moving the squeegee 21.

The screen printing plate 1 of the present invention is provided with the opening portion 2 that discharges the printing material 12 for forming the target printing pattern 4 onto the matter to be printed 11 in the screen printing.

The size of the opening portion 2 is reduced from the target printing pattern 4, by which the printing material 12 can match the shape of a printing pattern 5 after printing with the shape of the target printing pattern 4.

Since the opening end portion 3 of the opening portion 2 has the projection and recess pattern shape different from the target printing pattern shape 4, a bleeding width of the printing material 12 is increased in the vicinity of a recess portion 7 in the projection and recess pattern of the opening end portion 3 in the opening portion 2 and the bleeding width is decreased in the vicinity of a projection portion 6 in the screen printing, and thus, the printing pattern 5 after printing becomes a smooth and regular shape. This is totally opposite the fact that when a conventional example with an opening end portion of an opening portion in the shape similar to the target pattern shape has a straight end portion, the printing material bleeds irregularly, which can not be controlled, and as a result, the target printing pattern can not be formed.

As mentioned above, the irregularity of the printing pattern due to bleeding of the printing material 12 can be prevented, that is, the printing pattern shape after occurrence of bleeding can be controlled and then, even if the target printing pattern 4 is a fine design, the pattern shape can be printed as intended accurately and with high transfer performance.

For example, as shown in FIG. 2, in the case of printing operation using the screen printing plate 1 with a triangular wave as the opening end portion 3 of the opening portion 2, the printing pattern after printing becomes the smooth pattern 5 having the same cycle as the triangular wave due to the bleeding phenomenon.

Figure 3:
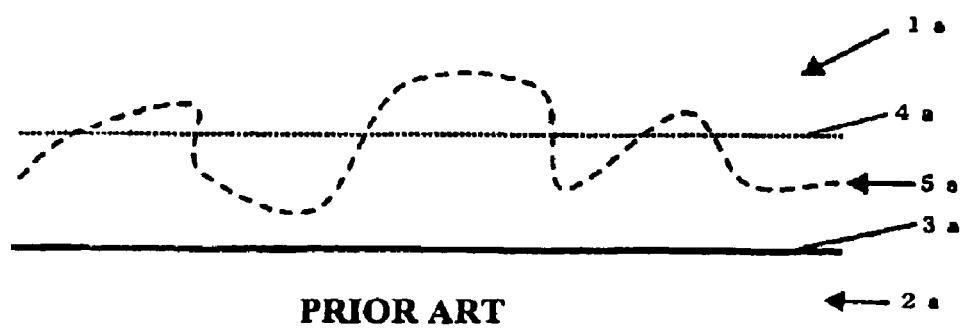
FIG. 3 is an outline plan view illustrating an example of a conventional screen printing plate, in which an opening end portion of an opening portion has a straight shape.

Similar to the case of a straight opening end portion 3a shown in FIG. 3, the printing pattern 5 after printing, which is an end portion of the printing material 12, is expanded from the opening portion due to bleeding. However, the shape of the printing pattern 5 after printing is in the shape in which corner portions of the triangular wave at the boundary is dulled (rounded), and the cycle of the end portion shape matches the cycle of the triangular wave on the boundary. That is, it does not become an irregular pattern as 5a in FIG. 3.

Figure 4:
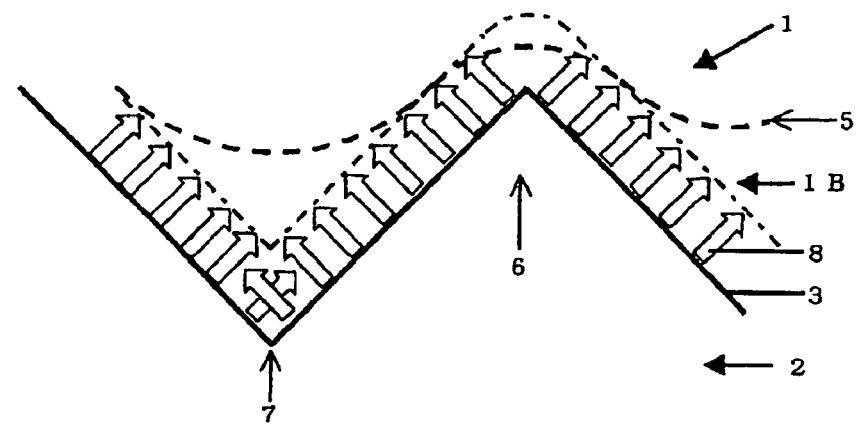
FIG. 4 is an outline view for explaining a bleeding phenomenon in the screen printing by the screen printing plate of the present invention.

The reason why the corner portions of the triangular wave are dulled will be explained using FIGS. 4 and 9. First, in the screen printing, the printing material 12 is pushed out of the opening portion 2 by a sliding operation of the squeegee 21 and brought into contact with the surface of the matter to be printed 11. Ideally, it is preferable that the contact face between the printing material 12 and the matter to be printed 11 is limited immediately below the opening portion 2, but because of the principle of printing that a certain pressure is applied onto the printing material 12 to be pushed out of the opening portion 2 of the screen printing plate 1, bleeding out of the printing material 12 into a space between a non-opening portion 1B of the screen printing plate and the matter to be printed 11 can not be avoided.

A volume of the printing material 12 bleeding below the non-opening portion 1B from the opening end portion 3 is the same per unit length of the opening end portion 3. Also, the printing material 12 bleeds in the perpendicular direction of the opening end portion 3 as shown by an arrow in FIG. 4 when bleeding from the opening portion 2 to below the non-opening portion 1B. As a result, an ideal bleeding width is equidistance from the opening end portion 3 and should be as shown by a one-dot chain line in the figure.

However, in the periphery of the projection portion 6 in the opening portion 2 and the periphery of the recess portion 7 in the opening portion 2, the density of an arrow 8 is different from other straight portions. Moreover, the density of the arrow 8 is also different between the periphery of the projection portion 6 in the opening portion 2 and the periphery of the recess portion 7 in the opening portion 2. Naturally, the volume of the bleeding-out printing material 12 is small immediately below the recess portion of the non-opening portion 1B (in the periphery of the distal end of the projection portion 6 in the opening portion 2), while the volume of the bleeding-out printing material 12 is large immediately below the projection portion of the non-opening portion 1B (area surrounded by the recess portion 7 of the opening portion 2).

As a result, the bleeding width is small immediately below the recess portion of the non-opening portion 1B (in the periphery of the distal end of the projection portion 6 in the opening portion 2), while the bleeding width is large immediately below the projection portion of the non-opening portion 1B (area surrounded by the recess portion 7 of the opening portion 2). And the end face of the printing material 12 (broken line in the figure) is in the shape canceling the projections and recesses of the opening portion 2 and the corner portions are dulled (rounded).

By this phenomenon that the corner portions are rounded, using a phenomenon that an amplitude of the printing pattern 5 after printing is smaller than an amplitude of the opening portion 2 and the opening end portion 3 of the non-opening portion 1B, the shape of the printing pattern 5 after printing is brought close to the shape of the target printing pattern 4 for controlling the bleeding shape, which is the principle of the present invention.

For that purpose, it is only necessary to produce a periodic wave such as a triangular wave in the size substantially equal to or smaller than the size of bleeding in the originally used printing condition at the opening portion 2. Naturally, by setting the cycle and amplitude of the periodic wave of the opening end portion 3 sufficiently larger than the size of the original bleeding, the bleeding at a straight portion in the periodic wave can not be ignored any more.

Figure 5A:
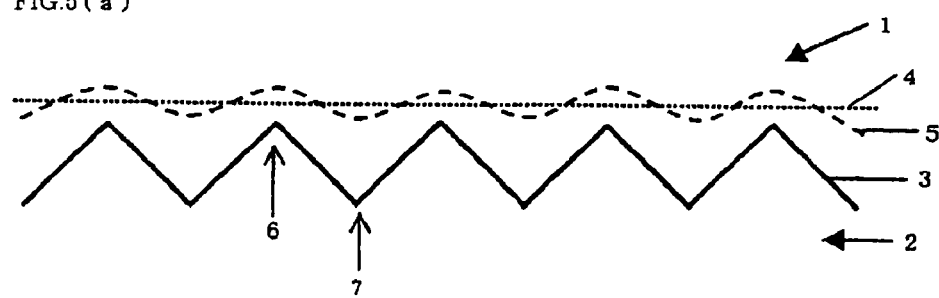
FIG. 5 is an outline plan view illustrating an example of the screen printing plate of the present invention, in which an end portion of the target printing pattern is in (a) straight state and (b) curved state.

For example, if the shape of the target printing pattern 4 in a straight state as shown by a dot line in FIG. 5A is to be obtained, the projection and recess pattern is produced with an amplitude smaller than the bleeding width in the used printing condition so that the projection and recess in the shape of the printing pattern 5 after printing is made small.

Figure 5B:
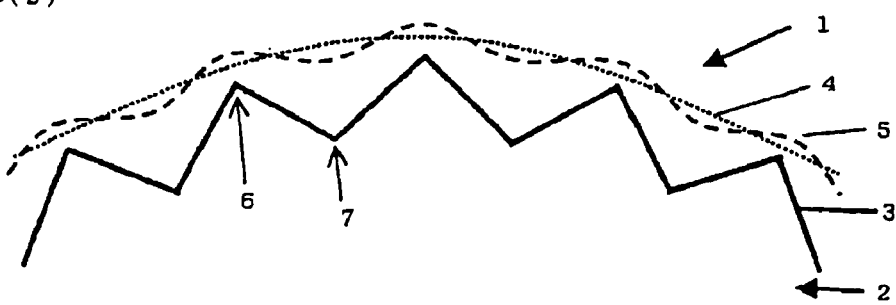

If the shape of the target printing pattern 4 in a curved state as shown by a dot line in FIG. 5B is to be obtained, the projection and recess pattern is produced with amplitude smaller than the bleeding width with the center of the amplitude conforming to the shape of the desired target printing pattern 4.

At this time, the projection and recess patterns shape of the opening end portion 3 of the opening portion 2 is preferably set so that the projection portion 6 is located at a position reduced by 0 to 25 μm from the end portion of the target printing pattern 4, by which the shape of the printing pattern 5 after printing when the printing material 12 bleeds can be matched with the shape of the target printing pattern 4 more accurately.

Also, in the projection and recess pattern shape of the opening end portion 3 of the opening portion 2, since the height of the projection portion 6 with respect to the recess portion 7 is 5 to 25 μm, the bleeding width of the printing material 12 can be increased in the vicinity of the recess portion 7 and the bleeding width in the vicinity of the projection portion 6 can be decreased more effectively, the printing pattern 5 after printing can be made smooth and matched with the target pattern 4 more effectively.

Moreover, in the projection and recess pattern shape of the opening end portion 3 of the opening portion 2, the cycle of the projection and recess pattern is preferably 5 to 50 μm, by which the bleeding width of the printing material 12 in the vicinity of the recess portion 7 can be increased and the bleeding width in the vicinity of the projection portion 6 can be decreased more effectively, and the printing pattern 5 after printing can be made smooth and regular more effectively. The shape of the regular printing pattern has its cycle matched with the projection and recess pattern of the opening end portion 3. Therefore, the shape of the pattern 5 after printing can be freely controlled.

Also, the projection and recess pattern shape of the opening end portion 3 of the opening portion 2 preferably has the width of the recess portion 7 at 5 to 25 μm. By this setting, the bleeding width of the printing material 12 in the vicinity of the recess portion 7 can be increased more effectively, and the printing pattern 5 after printing can be made smooth more effectively.

Moreover, the projection and recess pattern shape of the opening end portion 3 of the opening portion 2 is preferably at least any one of the shapes of a triangular wave, a rectangular wave and a sinusoidal wave or a combination of those shapes so that the projection and recess pattern having simple and accurate synchronization can be formed, design and manufacture of the projection and recess pattern is easy, and manufacturing costs can be kept low. Also, with such a pattern, the printing material easily bleeds in the recess portion and the pattern after printing can be made flat easily.

Also, as shown in FIG. 6, the projection and recess pattern shape of the opening end portion 3 of the opening portion 2 is preferably comprises a cyclically formed bag-state recess portion 7B, by which a spot where bleeding is positively generated can be produced and the bleeding can be controlled more effectively. The bleeding can be positively guided immediately below the non-opening portion 1B surrounded by the opening portion 2 in the bag state.

Figure 6A:
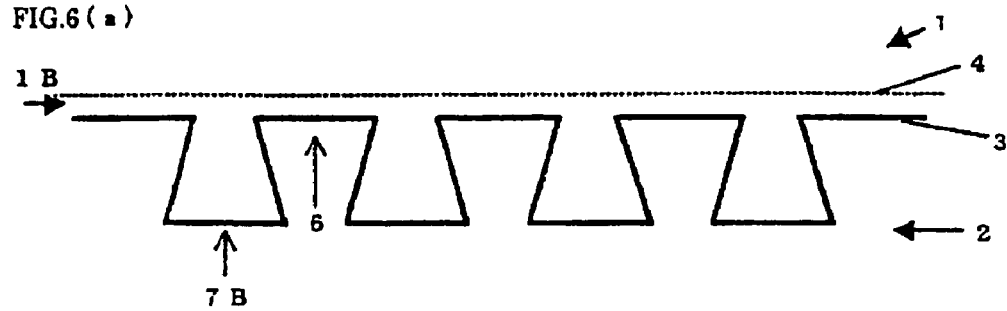
FIG. 6 is an outline plan view illustrating an example of the screen printing plate of the present invention, in which the projection and recess pattern shape of the opening end portion of the opening portion has a bag-state recess portion ((a) trapezoidal, (b) circular) formed.
Figure 6B:
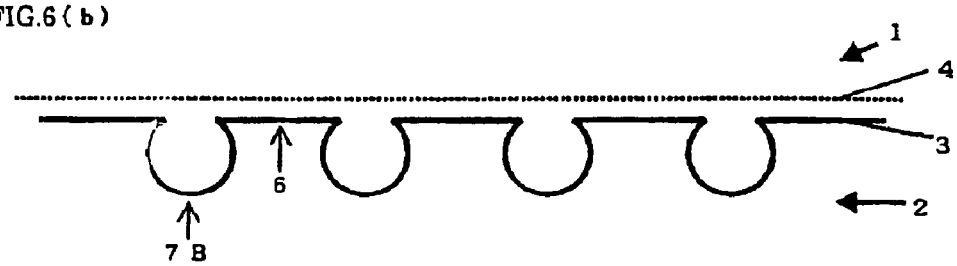

Moreover, the shape of the above bag-state recess portion 7B is preferably trapezoidal as shown in FIG. 6A or circular as shown in FIG. 6B, by which the bleeding can be generated in the recess portion and filled by the printing material more easily, design and manufacture of the bag-state recess portion 7B is easy, and manufacturing costs can be kept low.

Here, as the matter to be printed 11, a flat plane is preferable in view of cost, but a recess portion such as a groove and a hole may be provided. In that case, when grinding work is used as a working method, the recess portion becomes a groove shape.

Also, as the matter to be printed 11, a silicon single-crystal wafer is used, for example, and particularly a silicon wafer for solar cell is used, but the shape, properties and the like of the wafer in that case are not limited. For example, the present invention can be applied to printing of a finger electrode or a bus bar electrode as an electrode pattern of a solar cell. As the matter to be printed 11 of the present invention, the present invention can be also applied to those materials other than the silicon single crystal wafer, and the material may be a print circuit board requiring complicated pattern printing.

The squeegee 21 comprises a squeegee rubber 15, which is a member for applying the printing material 12 on the matter to be printed 11, and a squeegee jig 16 supporting the squeegee rubber 15 as shown in FIG. 9 and can be parallelly moved by a parallel moving mechanism 20 moving on a guide rail 27 while controlling a printing pressure and moving speed on the screen printing plate 1. The squeegee 21 moves parallelly on the screen printing plate 1 and has the printing material 12 discharged through the opening portion 2 so as to be applied on the matter to be printed 11.

The parallel moving mechanism 20 is preferably provided with means for controlling the moving speed through a connection portion of the squeegee jig 16 directly fixed onto the guide rail 27 and moreover, the squeegee jig 16 or the parallel moving mechanism 20 is preferably provided with an actuator for printing pressure adjustment for adjusting a pressure of the squeegee 21 for pressing the screen printing plate 1 through the printing material 12.

In this case, by connecting the actuator to an actuator control circuit or the like and vertically moving the squeegee 21 by a compressed air or electricity, the pressure of the squeegee 21 for pressing the screen printing plate 1 can be adjusted.

With the guide rail 27, as shown in FIG. 9, for example, a column 26 provided with an actuator 25 for guide rail height control is mounted on a plate frame 24 of the screen printing plate 1 and the guide rail 27 can be installed thereon. In this case, the squeegee 21 can be fixed to the parallel moving mechanism 20 by the squeegee jig 16, and the squeegee jig 16 is capable of smooth sliding in parallel with the screen printing plate 1 by the guide rail 27. The height of the squeegee 21 with respect to the screen printing plate 1 can be controlled by adjusting the height of the guide rail 27 using the actuator 25 for guide rail height control.

By parallelly moving the squeegee 21 through the parallel moving mechanism 20 in the screen printing apparatus 10 of the present invention as mentioned above so that the printing material 12 is discharged through the opening portion 2 of the screen printing plate 1 and applied on the matter to be printed 11, since the opening end portion 3 of the opening portion 2 in the screen printing plate 1 has a projection and recess pattern shape different from the target printing patterns shape, the bleeding width of the printing material 12 is increased in the vicinity of the recess portion 7 in the projection and recess pattern at the opening end portion 3 of the opening portion 2 and the bleeding width is decreased in the vicinity of the projection portion 6, and the end portion of the printing pattern becomes a smooth and regular shape.

Therefore, since irregularity of the printing pattern shape due to bleeding of the printing material 12 can be prevented, even if the target printing pattern 4 is a fine design, the pattern shape as intended can be printed accurately and with high transfer performance.

Embodiments and a comparative example are shown below for more specific explanation of the present invention, but the present invention is not limited thereto.

EXAMPLES

Figure 7:
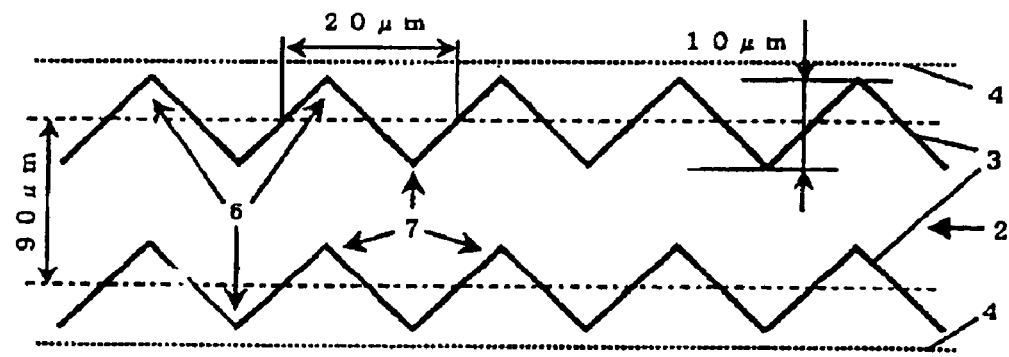
FIG. 7 is an outline plan view illustrating an example of the screen printing plate of the present invention, in which the projection and recess pattern shape of the opening end portion of the opening portion is a triangular wave and the target printing pattern is a band state (Example 1).

Comparative Example 150 pieces of silicon single-crystal wafer with the thickness of 300 μm and diameter of 125 mm are prepared and damage is removed by a solution of potassium hydroxide, and then, the screen printing plate 1 having an opening portion with a distance between amplitude centers of triangular waves at 90 μm from the opening end portion of the opening portion as shown in FIG. 7 by the triangular wave with the amplitude of 10 μm and cycle of 20 μm (Example 1).

Figure 8:
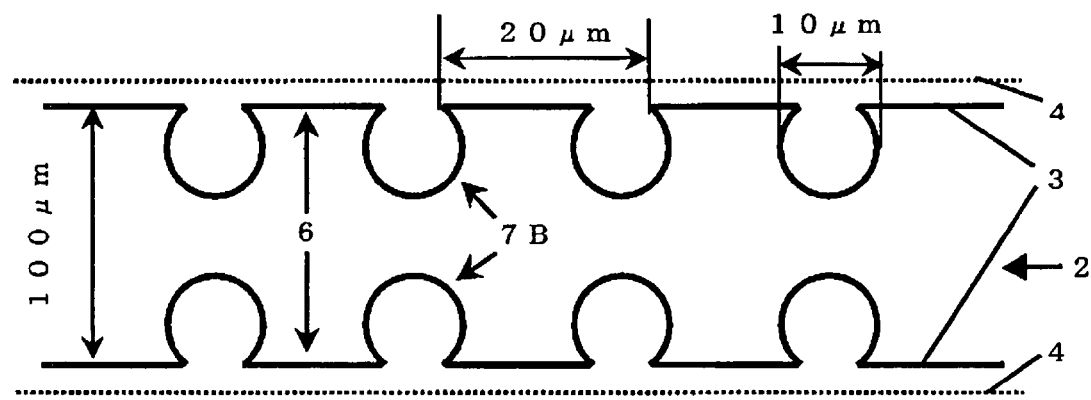
FIG. 8 is an outline plan view illustrating an example of the screen printing plate of the present invention, in which the projection and recess pattern shape of the opening end portion of the opening portion is a circular bag-state recess portion and the target printing pattern is a band state (Example 2).

A screen printing plate with the recess portion in the bag state (circular) 7B as shown in FIG. 8, which is a screen printing plate with the circular bag portion having the diameter of 10 μm, cycle of 20 μm and the opening width of 100 μm (Example 2) is prepared.

On the other hand, a screen printing plate having a straight opening end portion with the opening width of 100 um is also prepared for comparison (Comparative example).

For all the plates, gauze produced by a stainless thin wire is used for the screen printing plate. The mesh number is 380 and the emulsion thickness is 15 μm.

Next, using each of the above, a conductive paste is printed on the silicon single-crystal wafer by 50 pieces (150 pieces in total). Viscosity of the conductive paste is 50 Pa·s.

The printing condition of the present invention is set at the force of the squeegee for pressing the screen printing plate at 300 N and the squeegee speed at 150 mm/s.

Next, using an optical microscope, a printing width of the conductive paste on the wafer surface after printing is measured. The maximum values, minimum values, and median values of the obtained printing width are shown in Table 1.

TABLE 1

| | | Example 1 | Example 2 | Comparative Example |
|---|---|---|---|---|
| Printing width (μm) | Min. value | 97 | 105 | 113 |
| | Max. value | 105 | 117 | 138 |
| | Median value | 101 | 111 | 126 |
| Difference between min. and max. (μm) | | 8 | 12 | 25 |

From the above result, the median value of the printing width is 101 μm for Example 1, 111 μm for Example 2 of the present invention, and 126 μm for the Comparative example.

The difference between the maximum value and the minimum value of the printing width is different between Example 2 and the Comparative example by more than twice. This is a large difference. In this experiment, the shape of the printing pattern after printing close to a straight line as much as possible is to be obtained, and the advantage of end-face flattening of the printing material by the present invention is known to be large.

There is also a large difference in the maximum value between Example 1 and Example 2. That is because the bleeding in the straight portion in Example 2 has a large influence.

The present invention is not limited to the embodiment described above. The above-described aspects are mere examples and those having substantially the same structure as technical ideas described in the appended claims and providing the similar functions and advantages are included in the scope of the present invention.

The invention claimed is:

1. A screen printing plate comprising at least an opening portion that discharges a printing material for forming a target printing pattern on a matter to be printed by screen printing, the opening portion having an opening end portion,
   wherein the target printing pattern has a predetermined size and shape;
   a size of the opening portion is reduced from the size of the target printing pattern;
   the opening end portion of the opening portion has a projection and recess pattern of a different shape than the target printing pattern shape;
   a shape of the projection and recess pattern has an amplitude smaller than: (1) a predetermined bleeding width of a printing condition, or (2) a predetermined bleeding width with a center of the amplitude of the shape of the projection and recess pattern conforming to the shape of the target printing pattern; and
   the shape of the projection and recess pattern having a projection portion located at a position reduced from the target printing pattern by an amount X where $0 < X \leq 25$ μm.

2. The screen printing plate according to claim 1, wherein the projection and recess pattern shape of the opening end portion of the opening portion has a height of the projection portion with respect to a recess portion at 5 to 25 μm.

3. The screen printing plate according to claim 2, wherein the projection and recess pattern shape of the opening end portion of the opening portion has a cycle of the projection and recess pattern at 5 to 50 μm.

4. The screen printing plate according to claim 3, wherein the projection and recess pattern shape of the opening end portion of the opening portion has a width of the recess portion at 5 to 25 μm.

5. The screen printing plate according to claim 1, wherein the projection and recess pattern shape of the opening end portion of the opening portion has a cycle of the projection and recess pattern at 5 to 50 μm.

6. The screen printing plate according to claim 1, wherein the projection and recess pattern shape of the opening end portion of the opening portion has a width of the recess portion at 5 to 25 μm.

7. The screen printing plate according to claim 1, wherein the projection and recess pattern shape of the opening end portion of the opening portion is at least any one of shapes of a triangular wave, a rectangular wave and a sinusoidal wave or a combination of the shapes.

8. The screen printing plate according to claim 1, wherein the projection and recess pattern shape of the opening end portion of the opening portion has a bag-state recess portion formed cyclically.

9. The screen printing plate according to claim 8, wherein the shape of the bag-state recess portion is circular or trapezoidal.

10. A screen printing apparatus comprising at least the screen printing plate according to claim 1, a squeegee for having a printing material discharged through the opening portion by parallel movement on the screen printing plate for applying the printing material on the matter to be printed, and a parallel moving mechanism for parallelly moving the squeegee.

* * * * *